United States Patent [19]

Duehren et al.

[11] Patent Number: 4,584,532
[45] Date of Patent: Apr. 22, 1986

[54] SWITCHED CAPACITOR ENVELOPE DETECTOR

[75] Inventors: David W. Duehren, Boston, Mass.; Michael D. Smith, Austin, Tex.

[73] Assignee: Motorola, Inc., Schaumburg, Ill.

[21] Appl. No.: 420,145

[22] Filed: Sep. 20, 1982

[51] Int. Cl.[4] .................. H03K 5/00; H03K 5/153; H03K 5/22
[52] U.S. Cl. .................................. 328/151; 307/350; 307/236; 307/262; 328/26; 328/167
[58] Field of Search .................. 328/146, 149, 127, 26, 328/151, 167, 140, 150; 330/9, 107; 307/236, 494, 351, 350, 352, 262; 333/173

[56] References Cited

U.S. PATENT DOCUMENTS

| 3,828,259 | 8/1974 | Riethmuller et al. | 328/146 |
| 3,986,127 | 10/1976 | Ray | 307/494 |
| 4,179,665 | 12/1979 | Gregorian | 330/107 |
| 4,210,872 | 7/1980 | Gregorian | 330/9 |
| 4,306,197 | 12/1981 | Gregorian | 330/107 |
| 4,333,064 | 6/1982 | Kato et al. | 333/173 |
| 4,400,637 | 8/1983 | Klar et al. | 328/127 |
| 4,429,281 | 1/1984 | Ito et al. | 330/107 |
| 4,455,539 | 6/1984 | Wurzburg | 333/173 |

OTHER PUBLICATIONS

Szentirmai et al., "Switched-Capacitor Building Blocks", IEEE Trans. on Circuits and Systems, vol. CAS-27, No. 6, Jun. 1980, pp. 492-500.

Primary Examiner—Stanley D. Miller
Assistant Examiner—Timothy P. Callahan
Attorney, Agent, or Firm—Anthony J. Sarli, Jr.; Jeffrey V. Myers; Robert L. King

[57] ABSTRACT

An envelope detector comprising an absolute value detection portion and a filter portion implemented in switched capacitor technology with common circuit elements is provided. The absolute value of an input signal is obtained and an amplitude envelope is filtered therefrom. The absolute value detection portions and the filter portions share the same integrating operational amplifier to perform the envelope detection.

9 Claims, 2 Drawing Figures

SWITCHED CAPACITOR ENVELOPE DETECTOR

TECHNICAL FIELD

This invention relates generally to envelope detector circuits, and, more particularly, to a switched capacitor envelope detector.

BACKGROUND ART

Envelope detectors basically full wave rectify an input signal and filter the envelope of the resulting signal to provide an output signal which is representative of the envelope of the input signal. Envelope detectors are used in many applications including speech recognition systems which often rely upon the envelopes of several bandlimited sections of the speech input to provide a desired output. In discrete device technology, an envelope detector may be made by coupling an absolute value detector to a low pass filter. Such circuits typically are large and have diodes associated therewith which are very difficult to make in a standard MOS process. Others have implemented envelope detectors in switched capacitor technology as taught by P. E. Allen and E. Sanchez-Sinencio in a Texas A & M University text entitled *Switched Capacitor Circuits* (2nd Preliminary Edition May 1981). However, previous switched capacitor envelope detectors typically utilize at least one capacitor having a floating plate or electrode which is generally a source of error.

BRIEF SUMMARY OF THE INVENTION

Accordingly, it is an object of the invention to provide an improved envelope detector.

Another object of the present invention is to provide an improved envelope detector utilizing switched capacitor techniques.

Yet another object of the present invention is to provide an envelope detector having an absolute value detector portion and a filter portion which share the same circuitry.

In carrying out the above and other objects of the present invention, there is provided, in one form, an envelope detector having absolute value detection means and filter means. The absolute value means provide an absolute value signal from an input signal and amplify the input signal by using input switched capacitance means and an integrating operational amplifier. The filter means filter the amplitude envelope of the absolute value signal and comprise at least two integrating operational amplifiers. The first integrating operational amplifier of the filter means and the integrating operational amplifier of the absolute value means are the same integrating operational amplifier.

The above and other objects, features and advantages of the present invention will be more clearly understood from the following detailed description taken in conjunction with the accompanying drawings.

DESCRIPTION OF THE PREFERRED EMBODIMENT

Figure 1:
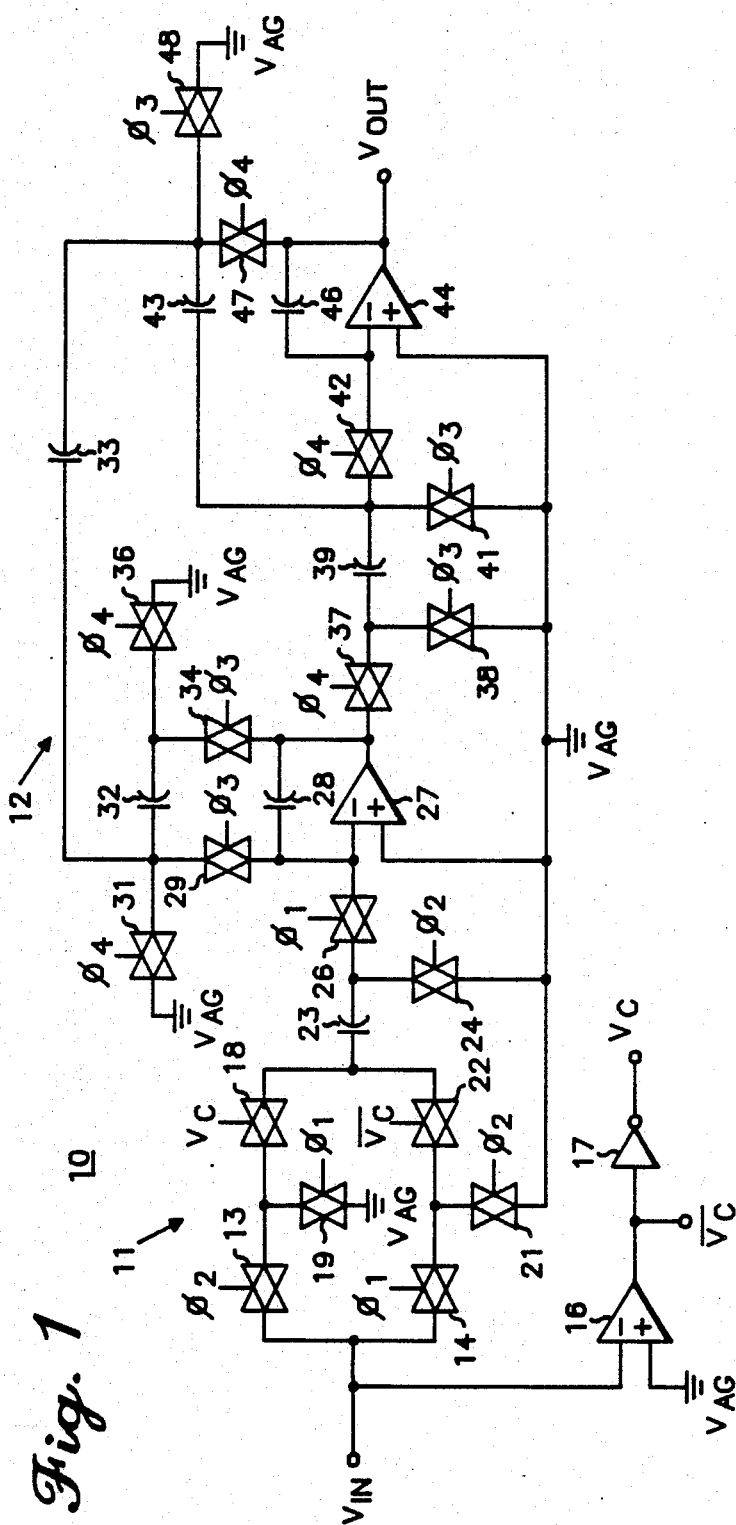
FIG. 1 illustrates in schematic form an envelope detector constructed in accordance with a preferred embodiment.

Shown in FIG. 1 is an envelope detector 10 which generally comprises an absolute value detection portion 11 and a filter means portion 12. In the preferred embodiment, all switches shown in FIG. 1 are CMOS transmission gates which are clocked in a conventional manner by signals $\phi_1$, $\phi_2$, $\phi_3$, and $\phi_4$ shown in FIG. 2 and the respective complements thereof and by signals $V_c$ and $\overline{V}_c$ to be described below. The switches are constructed to be conductive when a clock signal applied to the control input thereof is at a high logic state and nonconductive when the applied clock signal is at a low logic state.

In the absolute value detection portion 11, an input signal is coupled to first terminals of switches 13 and 14 and to an inverting input of a comparator 16. A noninverting input of comparator 16 is coupled to a reference voltage terminal, say analog ground, $V_{AG}$, and an output of comparator 16 provides a complement of a signal $V_c$ and is coupled to an input of an inverter 17. An output of inverter 17 provides signal $V_c$. Signal $V_c$ is a logic low level signal when $V_{IN}$ is less than $V_{AG}$ and is a logic high level signal when $V_{IN}$ is greater than $V_{AG}$. A second terminal of switch 13 is coupled to first terminals of switches 18 and 19. A second terminal of switch 14 is coupled to first terminals of switches 21 and 22. Switches 19 and 21 both have a second terminal coupled to reference voltage terminal $V_{AG}$. A second terminal of switch 18 is coupled to both a first electrode of a capacitor 23 and to a second terminal of switch 22. A second electrode of capacitor 23 is coupled to both a first terminal of a switch 24 and to a first terminal of a switch 26. A second terminal of switch 24 is coupled to reference voltage $V_{AG}$. A second terminal of switch 26 is coupled to an inverting input of an operational amplifier 27, to a first electrode of a feedback capacitor 28 and to a first terminal of a switch 29. A noninverting input of operational amplifier 27 is coupled to reference voltage terminal $V_{AG}$, and a second electrode of capacitor 28 is coupled to an output of operational amplifier 27. Switches 14, 19 and 26 have the control electrodes thereof coupled to signal $\phi_1$. Switches 13, 21 and 24 have the control electrodes thereof coupled to signal $\phi_2$. Switch 18 has a control electrode coupled to $V_c$ and switch 22 has a control electrode coupled to $\overline{V}_c$.

In the filter means portion 12, operational amplifier 27 and capacitor 28 of the absolute value detection portion 11 are also used as the first stage of filter means 12. A second terminal of switch 29 is coupled to a first terminal of a switch 31, to a first electrode of a feedback capacitor 32 and to a first electrode of a feedback capacitor 33. A second electrode of capacitor 32 is coupled to both a first terminal of a switch 34 and to a first terminal of a switch 36. A second terminal of switch 36 is coupled to voltage reference terminal $V_{AG}$. A second terminal of switch 34 is coupled to the output of operational amplifier 27. The output of operational amplifier 27 is coupled to a first terminal of a switch 37. A second terminal of switch 37 is coupled to a first terminal of a switch 38 and to a first electrode of a capacitor 39. A second terminal of switch 38 is coupled to reference voltage terminal $V_{AG}$. A second electrode of capacitor 39 is coupled to a first terminal of a switch 41, to a first terminal of a switch 42, and to a first electrode of a feedback capacitor 43. A second terminal of switch 41 is coupled to reference voltage terminal $V_{AG}$. A second terminal of switch 42 is coupled to an inverting input of an integrating operational amplifier 44 and to a first electrode of a feedback capacitor 46. Operational amplifier 44 has a noninverting input coupled to reference voltage terminal $V_{AG}$. A second electrode of feedback capacitor 46 is coupled to an output of operational amplifier 44 which provides an output voltage $V_{OUT}$. A second electrode of feedback capacitor 33 is coupled to a second electrode of feedback capacitor 43, to a first terminal of a switch 47 and to a first terminal of a switch 48. A second terminal of switch 48 is coupled to reference voltage terminal $V_{AG}$, and a second terminal of switch 47 is coupled to the output of operational amplifier 44. Switches 29, 34, 38, 41 and 48 each have a control electrode coupled to signal $\phi_3$ of FIG. 2. Switches 31, 36, 37, 42 and 47 each have a control electrode coupled to signal $\phi_4$ of FIG. 2.

In operation, comparator 16 compares input voltage $V_{IN}$ with reference voltage $V_{AG}$. When $V_{IN}$ changes from greater than to less than $V_{AG}$, comparator 16 will trip or change logic output states and provide $V_c$ at a first logic level. When $V_{IN}$ changes from less than to greater than $V_{AG}$, comparator 16 will trip in an opposite manner and provide $V_c$ at a second logic level. Signals $V_c$ and its complement allow $V_{IN}$ to be coupled to the first electrode of capacitor 23 via either switches 13 and 18 or switches 14 and 22. Switches 18 and 22 and comparator 16 perform the absolute value generation. In particular, switches 13 and 18 and switches 14 and 22 allow the input voltage to be charged onto capacitor 23 in a manner so that $V_{IN}$ is always presented to the inverting input of operational amplifier 27 as a negative signal. When $V_{IN}$ is at a high logic level with respect to $V_{AG}$, the output of comparator 16 is low and $V_c$ is at a high logic level. Therefore switch 18 is made conductive and $V_{IN}$ is allowed to charge onto capacitor 23 so that the first electrode of capacitor 23 is at a more positive potential than the second electrode thereof. This means that $V_{IN}$ is inverted before being fed into operational amplifier 27 and is a negative signal at the inverting input. Therefore after operational amplifier 27 amplifies $V_{IN}$, the output of operational amplifier 27 is positive. Similarly, when $V_{IN}$ is at a low logic level with respect to $V_{AG}$, the output of operational amplifier 16 is high and $V_c$ is at a low logic level. Therefore switch 22 is made conductive and $V_{IN}$ is allowed to charge onto capacitor 23 so that the first electrode of capacitor 23 is at a more negative potential than the second electrode thereof. This means that $V_{IN}$ is allowed to be coupled to operational amplifier 27 without any inversion and is a negative signal at the inverting input. Therefore, after operational amplifier 27 amplifies $V_{IN}$, the output of operational amplifier 27 is positive. Switches 13 and 18 and switches 14 and 22 provide alternate paths to capacitor 23 depending upon whether an inversion of the input signal is required. These four switches along with switches 24 and 26 comprise a "parasitic insensitive" switched capacitor structure.

It should be noted that operational amplifier 27 has a dual purpose. Not only is it used as an amplifier stage in absolute value detection portion 11 but it is also the first stage of filter means 12. Feedback capacitors 28, 32, 33, 39, 43 and 46 determine the poles and zeroes and frequency response of filter means 12 to create a low pass filter so that $V_{OUT}$ is a filtered signal representing the amplitude envelope of $V_{IN}$. Absolute value detection portion 11 may be clocked differently from filter means 12 to accurately control cutoff frequencies in filter means 12. The object is to obtain as low of a cutoff filter in frequency means 12 as possible so that $V_{OUT}$ does not move very fast. An envelope is created by filter means 12 which is always positive and is low pass filtered which basically strips off and provides the envelope of $V_{IN}$ which must be bandwidth limited to at least one half of the clocking frequency of $\phi_1$ and $\phi_3$. Therefore, the spectral energy of an input signal $V_{IN}$ at a predetermined frequency has been determined.

For the purpose of illustration only, assume that $V_{IN}$ is a sine wave. After being rectified via the operation of switches 13, 14, 18 and 22 and capacitor 23, $V_{IN}$ will have frequency components at DC and at all even harmonics. The amplitude roll-off is very gradual however, with the component which is ten times the fundamental frequency being only 40 dB below the DC component. Sampling such a signal without causing aliasing is usually a problem. The circuit of FIG. 1 overcomes the aliasing problem by sampling $V_{IN}$ and then full wave rectifying $V_{IN}$. The signal which is charged onto capacitor 28 is a continuous time signal that represents a rectified $V_{IN}$ after integration. Capacitor 32 adds damping so that capacitor 28 does not saturate, thereby effectively moving the pole from the origin to a cutoff frequency, $f_o$. Therefore the output signal of operational amplifier 27 is a continuous-time signal that is the rectified signal after filtering by a first order lowpass filter. Capacitor 32 does not cause aliasing because the signal of interest is the output voltage of operational amplifier 27 rather than the signal charged across capacitor 32. However, capacitor 32 does add frequency components to the output signal of operational amplifier 27 at integer multiples of its switching rate.

Figure 2:
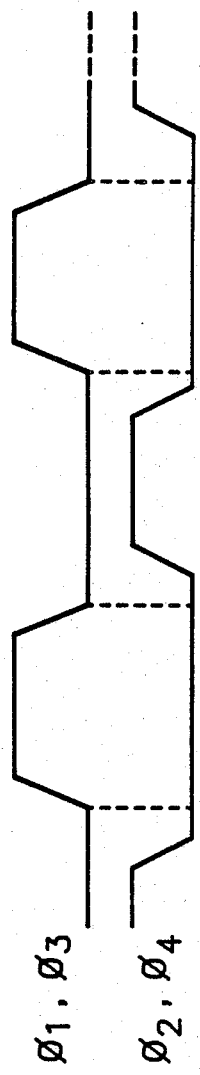
FIG. 2 illustrates in graphical form timing signals associated with the envelope detector of FIG. 1.

Aliasing does however occur when the output signal of operational amplifier 27 is sampled onto capacitor 39. Therefore, capacitor 32 and the sampling frequency must be chosen so that harmonics of the rectified signal are sufficiently attenuated. In a preferred embodiment, a clock frequency of 50 KHz for signals $\phi_1$ and $\phi_2$ is suggested and a clock frequency of 3125 Hz for signals $\phi_3$ and $\phi_4$ is suggested thereby providing a low pass cutoff frequency of approximately 30 Hz. However, these frequencies are given by way of example ony and any frequencies may be used. It is only important that the frequency of $\phi_3$ and $\phi_4$ be less than the frequency of $\phi_1$ and $\phi_2$ to allow the designer to choose an adequate low pass cutoff frequency and to maintain low capacitance values. It should also be noted that signal $\phi_1$ should always be kept relative to $\phi_2$ as shown in FIG. 2 and signal $\phi_3$ should always be kept relative to signal $\phi_4$ as shown in FIG. 2 regardless of the frequencies chosen for signals $\phi_1$ and $\phi_2$ and signals $\phi_3$ and $\phi_4$.

Since the circuit of FIG. 1 may be implemented by using "parasitic insensitive" switches, parasitic capacitance errors tend to be cancelled out. By now it should be appreciated that an envelope detector implemented in switched capacitor technology and using common circuit elements for performing an absolute value detection function and a filter function has been provided.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of this invention.

We claim:

1. An envelope detector for providing an amplitude envelope of an input signal, comprising:
   absolute value detection means having switching means and capacitance means, for providing an absolute value signal from said input signal by charging the input signal in response to the polarity of said input signal onto the capacitance means so that the absolute value signal always has the same polarity relative to a reference voltage; and
   filter means selectively coupled to the absolute value detection means, for providing the amplitude envelope of the input signal by filtering the amplitude envelope of said absolute value signal.

2. An envelope detector for providing an amplitude envelope of an input signal, comprising:
   first switching means having a first terminal coupled to an input terminal for receiving the input signal, a second terminal, and a control terminal for receiving a first control signal;
   second switching means having a first terminal coupled to the input terminal, a second terminal, and a control terminal for receiving a second control signal;
   third switching means having a first terminal coupled to the second terminal of the second switch, a second terminal coupled to a reference voltage terminal for receiving a reference voltage, and a control terminal coupled to the first control signal;
   fourth switching means having a first terminal coupled to the second terminal of the first switch, a second terminal coupled to the reference voltage terminal, and a control terminal for receiving the second control signal;
   fifth switching means having a first terminal coupled to the second terminal of the second switch, a second terminal, and a control terminal for receiving a value control signal;
   sixth switching means having a first terminal coupled to the second terminal of the first switch, a second terminal, and a control terminal for receiving the value control signal;
   capacitance means having a first electrode coupled to the second terminals of the fifth and sixth switching means and a second electrode, for storing the input signal to provide an absolute value of the input signal;
   seventh switching means having a first terminal coupled to the second electrode of the capacitance means, and a second terminal coupled to the reference voltage terminal;
   eighth switching means having a first terminal coupled to the second electrode of the capacitance means and a second terminal; and
   filter means coupled to the eighth switching means, for providing the amplitude envelope of the input signal by filtering the amplitude envelope of said absolute value of the input signal.

3. The envelope detector of claim 2 wherein said value control signal is provided by comparator means having a first input coupled to the input voltage, a second input coupled to the reference voltage, and an output for providing the value control signal, said value control signal indicating whether the input voltage is greater than or less than the reference voltage.

4. The envelope detector of claim 3 wherein said first and second control signals are nonoverlapping clock signals.

5. The envelope detector of claim 1 wherein said filter means is a low pass filter having at least first and second integrating operational amplifiers, wherein the first integrating operational amplifier both amplifies and filters the absolute value signal.

6. The envelope detector of claim 5 wherein said first integrating operational amplifier comprises:
   an operational amplifier having a first input coupled to the second terminal of said second switch, a second input coupled to said reference voltage terminal, and an output; and
   feedback means comprising second capacitance means having a first electrode coupled between the first input of said operational amplifier and the output of said operational amplifier.

7. The envelope detector of claim 4 wherein said filter means further comprise:
   second feedback means comprising third capacitance means having a first electrode alternately coupled between the first input of said first operational amplifier and said reference voltage terminal, and a second electrode alternately coupled between the output of said operational amplifier and said reference voltage terminal;
   said second integrating operational amplifier having a first input, and a second input coupled to said reference voltage terminal;
   third feedback means comprising fourth capacitance means coupled between the first input of said second operational amplifier and an output of said second operational amplifier;
   fourth feedback means comprising fifth capacitance means having a first electrode alternately coupled between the output of said first operational amplifier and said reference voltage terminal, and a second electrode alternately coupled between the first input of said second operational amplifier and said reference voltage terminal;
   fifth feedback means comprising sixth capacitance means having a first electrode alternately coupled between the first input of said second operational amplifier and said reference voltage terminal, and a second electrode alternately coupled between the output of said second operational amplifier and said reference voltage terminal; and
   sixth feedback means comprising seventh capacitance means having a first electrode alternately coupled to the first input of said first operational amplifier and to said reference voltage terminal, and a second electrode alternately coupled to the output of said second operational amplifier and to said reference voltage terminal.

8. An envelope detector, for determining the spectral energy content of an input signal and filtering an amplitude envelope of said input signal, comprising:
   input switching means having an input terminal for receiving said input signal and an output terminal for always providing the input signal in the same polarity relative to a reference voltage;
   a first capacitor having a first electrode coupled to the output terminal of said input switching means, and a second electrode;
   a first switch having a first terminal coupled to the second electrode of said capacitor, and a second terminal coupled to a reference voltage terminal;
   a second switch having a first terminal coupled to both the second electrode of said capacitor and the first terminal of said first switch, and a second terminal;

a first integrating operational amplifier having an inverting input coupled to the second terminal of said second switch, a noninverting input coupled to the reference voltage terminal, and an output;

a second capacitor having a first electrode coupled to the inverting input of said first integrating operational amplifier, and a second electrode coupled to the output of said first integrating operational amplifier;

first switched capacitance means comprising a third capacitor having a first electrode alternately coupled between the inverting input of said first integrating operational amplifier and the reference voltage terminal, and a second electrode alternately coupled between the reference voltage node and the output of said first integrating operational amplifier;

a second integrating operational amplifier having a noninverting input coupled to the reference voltage terminal, an inverting input and an output;

second switched capacitance means comprising a fourth capacitor having a first electrode alternately coupled between the output of said first integrating operational amplifier and the reference voltage terminal, and a second electrode alternately coupled between the inverting input of said second integrating operational amplifier and said reference voltage terminal;

a fifth capacitor having a first electrode coupled to the inverting input of said second integrating operational amplifier, and a second electrode coupled to the output of said second integrating operational amplifier;

a sixth capacitor having a first electrode alternately coupled between said reference voltage terminal and the inverting input of said second integrating operational amplifier and a second electrode alternately coupled between said reference voltage terminal and the output of said second integrating operational amplifier; and a seventh capacitor having a first electrode alternately coupled between said reference voltage terminal and the integrating input of said first integrating operational amplifier, and a second electrode alternately coupled between said reference voltage terminal and the output of said second integrating operational amplifier.

9. A method of providing an amplitude envelope of an input signal, comprising the steps of:

receiving the input signal and comparing the input signal with a reference voltage to provide a compare control signal;

selectively switching the input signal to a charge storage device always in the same polarity relative to the reference voltage, said switching effected by switching means controlled by nonoverlapping clock signals and the compare control signal;

providing an absolute value signal from charge proportional to the switched input signal stored by the charge storage device and amplifying the absolute value signal with an amplifier to provide an amplified value signal; and filtering an amplitude envelope of said amplified absolute value signal to provide the amplitude envelope of the input signal.

* * * * *